United States Patent [19]

Müller

[11] 4,403,198
[45] Sep. 6, 1983

[54] BIASING CIRCUIT FOR MOSFET POWER AMPLIFIERS

[75] Inventor: Otward Müller, Lynchburg, Va.

[73] Assignee: General Electric Company, Lynchburg, Va.

[21] Appl. No.: 248,286

[22] Filed: Mar. 27, 1981

[51] Int. Cl.³ ............................................. H03F 3/30
[52] U.S. Cl. .................................. 330/264; 330/265; 330/276
[58] Field of Search ................. 330/85, 123, 146, 264, 330/265, 267, 270, 276, 290

[56] References Cited

U.S. PATENT DOCUMENTS

| | | | |
|---|---|---|---|
| 3,212,019 | 10/1965 | Schwartz | 330/275 |
| 3,428,909 | 2/1969 | Kam et al. | 330/276 |
| 3,449,686 | 6/1969 | Bladen | 330/133 X |
| 3,768,031 | 10/1973 | Ring | 330/262 |
| 3,808,545 | 4/1974 | Stanley | 330/265 |
| 3,872,390 | 3/1975 | Nash | 330/264 |
| 3,983,502 | 9/1975 | Wheatley, Jr. | 330/146 X |
| 4,021,751 | 5/1977 | Suzuki | 330/253 |
| 4,117,415 | 9/1978 | Hoover | 330/264 |
| 4,163,908 | 8/1979 | Price | 307/296 R |
| 4,213,098 | 7/1980 | Tsividis | 330/253 |

Primary Examiner—James B. Mullins
Attorney, Agent, or Firm—Cushman, Darby & Cushman

[57] ABSTRACT

A biasing circuit for MOSFET power amplifiers in complementary pair push-pull single ended or bridge configuration. The biasing circuit includes a complementary pair of bi-polar transistors operating as common base amplifiers. Each amplifier includes emitter and collector resistances. A portion of the collector resistance of each common base amplifier acts as a gate-source biasing resistor for an associated MOSFET power transistor. The active feedback circuit is responsive to the voltage at a center tap of the primary winding of the amplifiers output transformer. The effect of the active feedback arrangement is to reduce the closed loop voltage gain of a conventional bridge amplifier from approximately 8.5 to approximately 0.9 thereby minimizing voltage fluctuations at the center tap of the primary of the output transformer.

17 Claims, 3 Drawing Figures

BIASING CIRCUIT FOR MOSFET POWER AMPLIFIERS

BACKGROUND OF THE INVENTION

This invention relates in general to complementary pair push-pull single ended and bridge power amplifier configurations. Specifically, this invention provides an active feedback biasing circuit for controlling the DC bias level of the various amplifier elements used in the power amplifier.

With the advent of MOSFET power transistors, it became possible to provide, in push-pull and bridge power amplifier configurations, both high-voltage and high-speed operation not previously available with bi-polar power transistors. High-speed, high-voltage operation is highly advantageous in the practical embodiments of linear high fidelity power amplifiers operating in a frequency range up to 500 kHz. Such operation became possible because minority carrier storage does not occur in MOSFETS.

Using a complementary MOSFET power transistor pair such as the Hitachi 2SK135/2SJ50, it is possible to design push-pull and bridge amplifiers that can be operated from 48 volt and 125 volt battery sources. For the high voltage application (125 volts) a conventional bridge circuit, such as the one shown in FIG. 1, is suitable.

Referring now to FIG. 1, there is shown a conventional complementary pair push-pull bridge amplifier configuration. The bridge amplifier includes four MOSFET transistors Q1, Q2, Q3, and Q4 operating as the individual amplifier elements. Transistors Q1 and Q2 form a complementary pair with Q1 being a P-channel enhancement MOSFET and Q2 being an N-channel enhancement MOSFET, Q1 and Q2 forming a complementary pair. Similarly, Q3 is a P-channel enhancement MOSFET and Q4 is an N-channel enhancement MOSFET, Q3 and Q4 forming a complementary pair.

A resistive voltage divider including resistors R1, R2, R3 and R4 provide a gate-source bias voltage $V_{gs}$ for each of MOSFET transistors Q3 and Q4. In a typical application, R1 is 1K ohm, R2 is 1K ohm, R3 is 60K ohms and R4 is 60K ohms. Thus, $$\frac{R_1}{R_3} = \frac{R_2}{R_4} = \frac{1}{60} \quad (1)$$

to provide a gate source bias voltage of approximately one (1) volt. Since $V_{gs}$ is small compared to the drain source voltage $V_{ds}$, the feedback ratio H where $$H = \frac{R_1}{R_3} = \frac{R_2}{R_4} = \frac{1}{60} \quad (2)$$

is also small. The open loop voltage gain G is of the order of magnitude of 10. The closed loop voltage gain is therefore governed by the following equation:

$$G_v = \frac{\Delta V_m}{\Delta V_{Gs}} = \frac{G}{1 + GH} = \frac{10}{1 + 0.1666} = 8.57 \quad (3)$$

With such a high closed loop voltage gain, there is an insufficiently small feedback factor that can be achieved with this circuit. As a result, the center tap voltage $V_M$ of output transformer T1 can deviate substantially from the intended $V_b/2$ due to any mismatch in the P/N channel transistor characteristics. Gate resistors $R_g$ are intended to increase input impedance. The biasing arrangement for Q1 and Q2 is similar to that provided for Q3 and Q4 previously described and therefore will not be further described here.

The bridge amplifier circuit shown in FIG. 1 incorporates a common source configuration in order to take advantage of the current limiting property of a MOSFET power transistor for short circuit protection. If a common drain configuration were used, the input drive voltage $V_i$ and $-V_i$ would be approximately equal to the high output voltage. Any short circuit condition in the load circuit $R_L$ of the secondary winding of transformer T1 would destroy the power transistors unless a fast protection circuit were provided. A common source circuit shown in the Figure survives output short circuit conditions even without such external protection. The self protection feature of the common source configuration for MOSFET amplifiers results from the absence of a "second breakdown" effect.

Using the conventional complementary pair push-pull bridge amplifier configuration shown in FIG. 1, that utilizes only a resistive voltage divider for biasing, a biasing problem occurs. Since the P and N channel transistor characteristics are not precisely matched, the voltage $V_m$ at the center tap of output transformer T1 is not equal to one-half of the supply voltage, even if adjusted for low and high output power levels. Under actual operating conditions $V_m$ can vary drastically. This variation can result in an unequal power dissipation distribution in the four power transistor amplifier elements. One known approach to solving the biasing problem is to apply passive local feedback to the bridge amplifier, i.e., the use of series-series feedback with source resistors. It has been found however, that series-series feedback with source resistors is either ineffective due to the much smaller transconductance of MOSFETS compared with bi-polar transistors or for large source resistors, the power loss in the resistors is too large. Local parallel-parallel feedback with drain-gate resistors has also proven ineffective since the feedback factor cannot be made sufficiently large if a high voltage transistor has a low threshold or turn-on gate source voltage. Thus, no satisfactory solution to the biasing problem has been found.

SUMMARY OF THE INVENTION

Therefore, there is provided by the present invention, a biasing circuit intended to replace the conventional resistive voltage divider used to bias the amplifier elements of a complementary pair push-pull single ended or bridge amplifier. The feedback biasing circuit includes a complementary pair of small signal bi-polar transistors arranged to provide two (2) common-base amplifier stages. Each common base amplifier stage includes a collector resistor combination, a portion of which acts as the gate-source biasing resistor of an associated MOSFET power transistor of the bridge amplifier. The voltage gain of the two bi-polar common base amplifiers is chosen to be small (substantially equal to 1).

The effect of the addition of the two bi-polar common base amplifiers is to reduce the closed loop DC voltage gain of the bridge amplifier from approximately 10 to approximately 0.9. Thus, any change in the gate to source voltage $V_{gs}$ produces an approximately ten times smaller change of voltage at the center tap of output transformer T1. A resistive divider, Zener diode and a potentiometer are provided for biasing the two common base amplifiers. Appropriate capacitors are provided to provide an AC short circuit for the AC signal being amplified by the bridge arrangement.

BRIEF DESCRIPTION OF THE DRAWINGS

A more complete description of the biasing circuit for MOSFET power amplifiers is provided in the following detailed description of the preferred embodiment and the appended claims when read in conjunction with the Figures, wherein:

DETAILED DESCRIPTION OF THE PREFERRED EMBODIMENT

Figure 1:
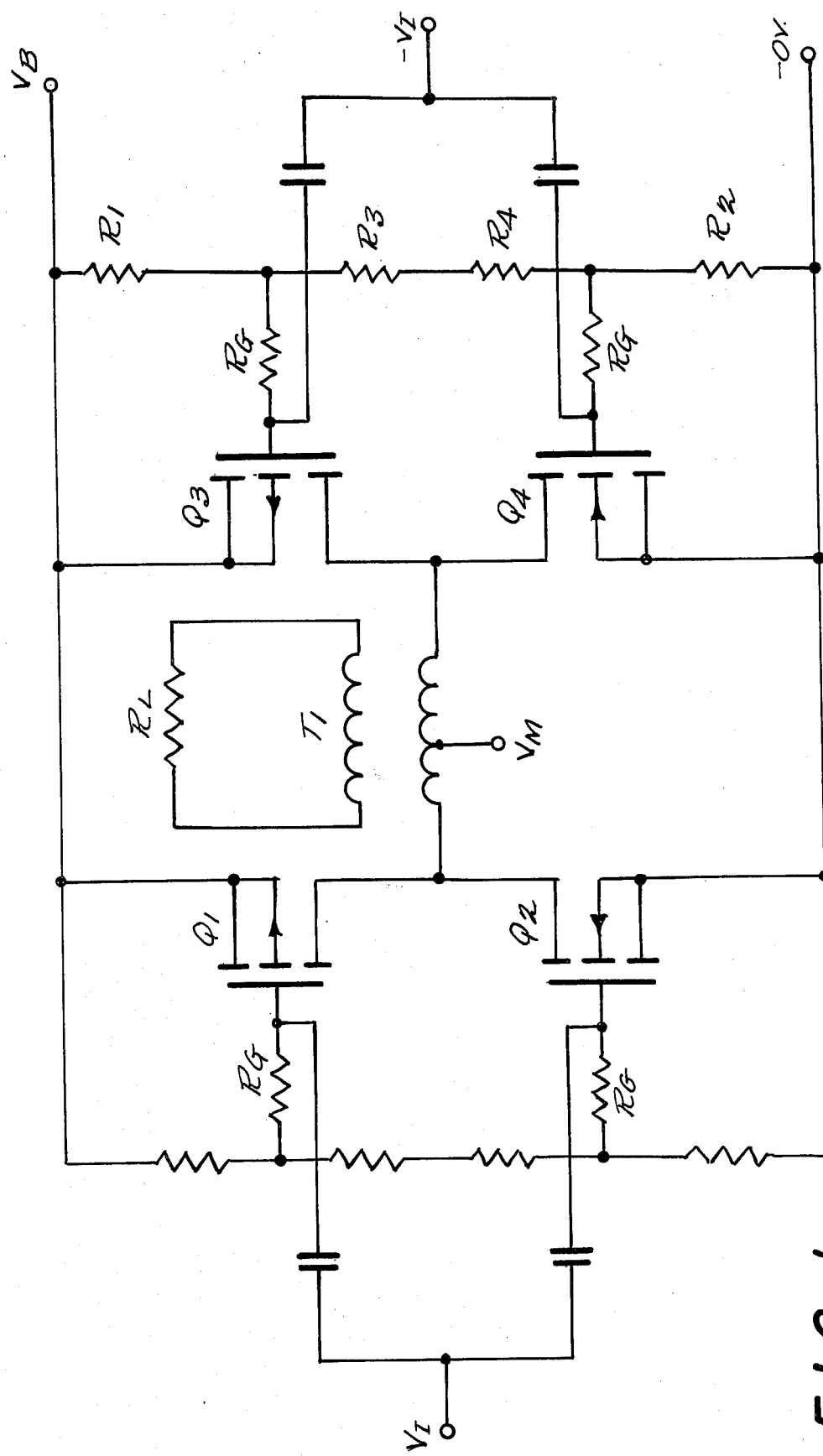
FIG. 1 is a schematic diagram of a complementary pair push-pull bridge amplifier according to the prior art.
Figure 2:
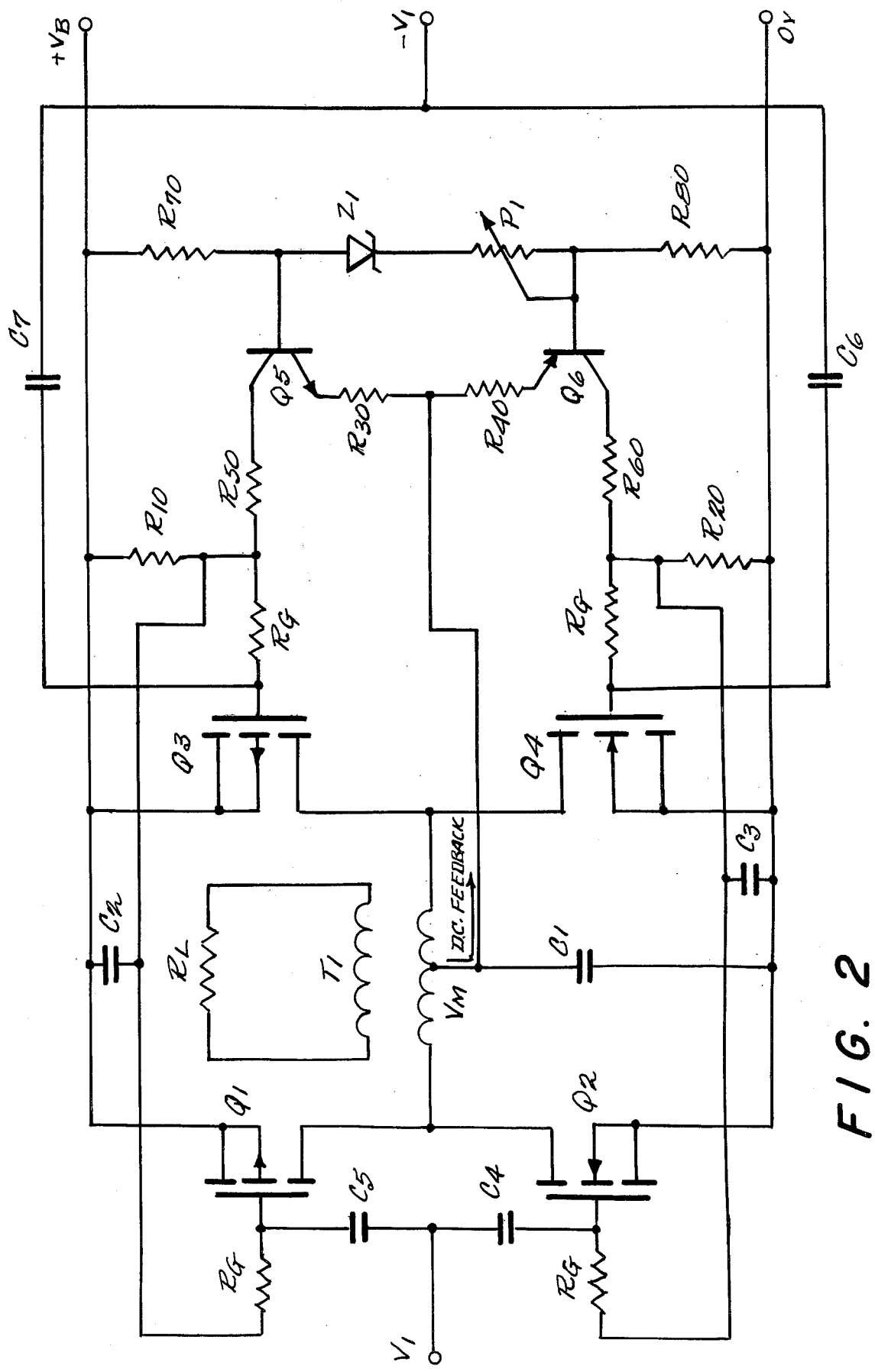
FIG. 2 is a common source bridge amplifier arrangement incorporating the biasing circuit of the present invention.

Referring now to FIG. 2 there is shown a schematic diagram of a bridge amplifier incorporating the biasing circuit according to the present invention. Corresponding parts to those shown in FIG. 1 (PRIOR ART) are referred to by the same reference numeral used therein. As in FIG. 1, the bridge amplifier uses four amplifier elements Q1, Q2, Q3 and Q4, each of which is a MOSFET power transistor. Q1 and Q3 are P-channel enhancement type MOSFETS and Q2 and Q4 are N-channel enhancement MOSFETS, Q1 and Q2 forming a complementary pair and Q3 and Q4 forming a complementary pair. A common source configuration is employed in order to take advantage of the current limiting property of a MOSFET transistor to provide short circuit protection. If a common drain configuration were used, the input drive voltage would be approximately equal to the high output voltage. Any short circuit condition in the load circuit of the secondary output transformer T1 would destroy the power transistors unless a fast protection circuit were provided. The common source circuit configuration set forth herein survives output short circuit conditions even without external protection circuitry.

Input signals, respectively out of phase by 180 degrees are coupled to input terminals V1 and −V1. The input signal coupled to terminal V1 is coupled through capacitors C5 and C4 to MOSFET power transistors Q1 and Q2 respectively. Similarly, the input signal coupled to input terminal −V1 is coupled through capacitors C7 and C6 to MOSFET power transistors Q3 and Q4 respectively. The drains of power transistors Q1 and Q2 are both coupled to one side of the primary winding of an output transformer T1. Similarly, the drains of power transistors Q3 and Q4 are coupled to the other end of the primary winding. The secondary winding of output transformer T1 is coupled to a load $R_1$.

The biasing circuit of the present invention replaces the resistive divider including resistors R1, R2, R3 and R4 associated with power transistors Q3 and Q4 and the corresponding resistive divider (unlabeled) associated with power transistors Q1 and Q2 in the circuit of FIG. 1. The biasing circuit includes two small signal bi-polar transistors Q5 and Q6 arranged in common base configuration and emitter resistor R30 couples the emitter of transistor Q5 to the center tap of transformer T1. Similarly, an emitter resistor R40 couples the emitter of transistor Q6 to the center tap of T1. The collector resistance of Q5 includes R10 and R50 in series coupled to a plus $V_B$ supply. The collector resistance of transistor Q6 includes $R_{20}$ and $R_{60}$ in series coupling it to the power supply return. A part of the collector resistance (R10 plus R50 for transistor Q5 and R20 plus R60 for transistor Q6) acts as a gate source biasing resistor for an associated MOSFET power transistor. Specifically, R10 serves as a gate source biasing resistor for power transistor Q3 and R20 serves as the gate source biasing resistor for power amplifier Q4. Gate resistors $R_G$ to each of power transistors Q1, Q2, Q3 and Q4 increase the input impedance thereof. A voltage divider including a resistor R70, a Zener diode Z1, a potentiometer P1 and a resistor R80 coupled in series between the $+V_B$ supply and the supply return provide biasing for transistors Q5 and Q6. Capacitors C1–C7 provide an AC short circuit for the input signal to be amplified.

The biasing circuit permits the implementation of any desired DC feedback factor H. The feedback factor H is governed by the ratio $$H = \frac{R_{10}}{R_{30}} = \frac{R_{20}}{R_{40}} \qquad (4)$$

In essence, H constitutes the voltage gain of biasing transistors Q5 and Q6 referred to the gate-source biasing voltage of the power amplifier transistors.

In the conventional bridge amplifier arrangement shown in FIG. 1, the resistive voltage dividers one of which includes resistors R1, R2, R3 and R4 provide a gate source bias voltage $V_{gs}$ of approximately one volt for MOSFET power transistors. Since $V_{gs}$ is small compared to the drain source voltage $V_{ds}$ of each power transistor, the feedback ratio H=R1/R3=R2/R4=1/60 for typical values of R1 and R2=1k ohm and R3 and R4=60k ohm is also small. The open loop voltage gain G is therefore in the order of magnitude of 10. The closed loop voltage gain is governed by equation (3), repeated here.

$$G_v = \frac{\Delta V_m}{\Delta V_{Gs}} = \frac{G}{1 + GH} = \frac{10}{1 + 0.1666} = 8.57 \qquad (3)$$

Thus, only an insufficiently small feedback factor can be achieved using the conventional circuit. As a result, voltage $V_m$ at the center tap of the primary winding of output transformer T1 can deviate drastically from $V_B/2$ due to any mismatch in the P/N-channel transistor characteristics.

However, the biasing circuit shown in FIG. 2 solves the inbalance problem by providing active DC feedback. The effective regulating DC voltage gain for the circuit of FIG. 2 is given by $$\frac{R_{10}}{R_{30}} = \frac{R_{20}}{R_{40}} \approx 1 \qquad (5)$$

The closed loop voltage gain is therefore given by:

$$G_v = \frac{V_m}{V_{Gs}} = \frac{G}{1 + GH} = \frac{10}{11} = 0.9 \qquad (6)$$

Thus, any change in $V_{gs}$ produces approximately a ten times smaller change of $V_m$. An actual prototype amplifier, constructed and tested in shown schematically in FIG. 3.

Figure 3:
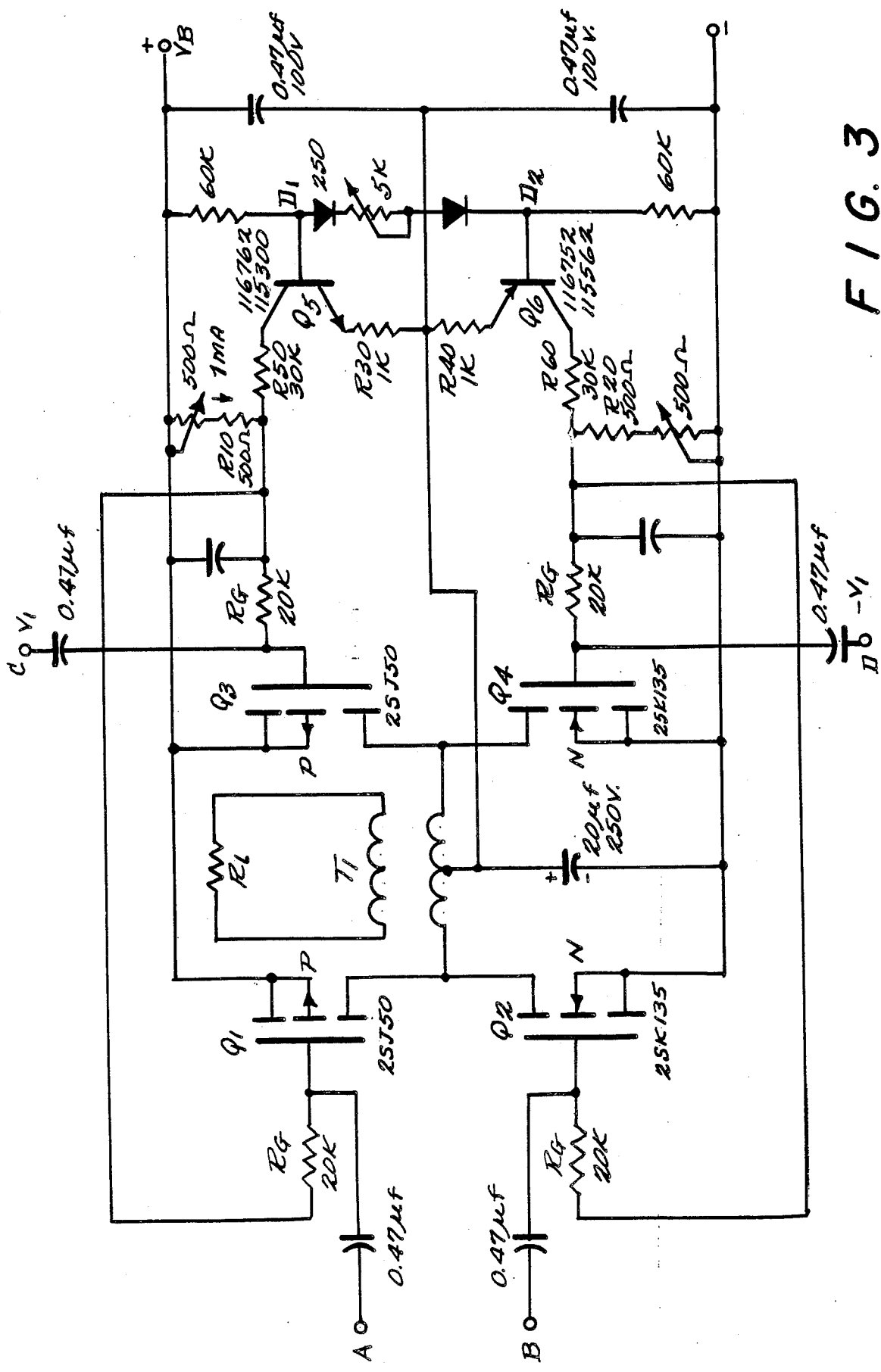
FIG. 3 is a practical embodiment of a bridge amplifier arrangement incorporating the biasing circuit of the present invention including part numbers and element values.

Referring now to FIG. 3 there is shown a prototype bridge amplifier arrangement including the biasing circuit for MOSFET power amplifiers according to the present invention, as actually constructed and tested. This circuit is intended for operation from a 125 volt source and provides approximately 100 watts. The circuit is in all substantive respect identical to that shown in FIG. 2. However, this circuit includes all component identifications and values. It utilizes Hitachi 2SK135/2SJ50 complementary pairs of MOSFET power transistors. In this particular embodiment, a pair of inexpensive diodes D1 and D2 are substituted for Zener diode Z1 shown in the FIG. 2 embodiment.

Of course, alternative embodiments and configurations will become apparent to those of ordinary skill in the art having the benefit of the teachings presented in this application. Therefore, it is intended that the appended claims cover such alternative embodiments.

I claim:

1. An amplifier circuit comprising:
   a complementary pair of MOSFET amplifier elements arranged in push-pull configuration;
   an output transformer having a center-tapped primary winding coupled to said MOSFET elements and a secondary winding for driving a load coupled thereto; and
   an active feedback circuit, resppponsive to a signal at the center tap of said primary winding, for controlling DC bias levels of said MOSFET amplifier elements, thereby preventing substantial fluctuation of the signal level at the center tap.

2. An amplifier according to claim 1 wherein said active feedback circuit comprises a bi-polar transistor pair arranged so as to provide two common-base amplifier stages.

3. An amplifier according to claim 2 wherein said common-base amplifier stages each include collector resistors and wherein a portion of such a collector resistor acts as a biasing resistor for a corresponding MOSFET amplifier element.

4. An amplifier according to claim 3 wherein said MOSFET amplifier elements are arranged in a common source configuration and wherein said portion of such a collector resistor acts as a gate-source biasing resistor for a corresponding MOSFET amplifier element.

5. An amplifier according to claim 2, 3, or 4 wherein the voltage gain of each common-base amplifier is substantially unity.

6. An amplifier circuit comprising:
   a complementary pair push-pull bridge configuration of power amplifier elements including at least four (4) amplifier elements;
   an output transformer having a center-tapped primary winding coupled to said amplifier elements and a secondary winding for driving a load coupled thereto; and
   an active feedback circuit, responsive to a signal at the center tap of said primary winding, for controlling the DC bias levels of said amplifier elements, thereby preventing substantial fluctuation of the signal level at the center tap.

7. An amplifier according to claim 6 wherein said amplifier elements comprise MOSFET power transistors arranged in a common source configuration.

8. An amplifier according to claim 6 wherein said active feedback circuit comprises a bi-polar transistor pair arranged so as to provide two common-base amplifier stages.

9. An amplifier according to claim 8 wherein said common-base amplifier stages each include collector resistors and wherein a portion of such a collector resistor acts as a biasing resistor for corresponding amplifier element.

10. An amplifier according to claim 9 wherein said amplifier elements are MOSFET power transistors arranged in a common source configuration and wherein said portion of such a collector resistor acts as a gate-source biasing resistor for a corresponding MOSFET power transistor.

11. An amplifier according to claim 8, 9, or 10 wherein the voltage gain of each common-base amplifier is substantially unity or of any suitable value.

12. An amplifier comprising:
    four (4) amplifier elements arranged in a complementary pair push-pull bridge configuration;
    an output transformer having a center-tapped primary winding, one side of said primary winding being coupled to each complementary pair and a secondary winding adapted to be coupled to a load; and
    an active feedback circuit, responsive to a signal at said center tap, for controlling the DC bias levels of the amplifier elements so as to maintain a bridge that is substantially in DC balance.

13. An amplifier according to claim 12 wherein said amplifier elements comprise MOSFET power transistors arranged in a common source configuration.

14. An amplifier according to claim 12 wherein said active feedback circuit comprises a bi-polar transistor pair arranged so as to provide two common-base amplifier stages.

15. An amplifier according to claim 14 wherein said common-base amplifier stages each include collector resistors and wherein a portion of such a collector resistor acts as a biasing resistor for corresponding amplifier element.

16. An amplifier according to claim 15 wherein said amplifier elements are MOSFET power transistors arranged in a common source configuration and wherein said portion of such a collector resistor acts as a gate-source biasing resistor for a corresponding MOSFET power transistor.

17. An amplifier according to claim 14, 15, or 16 wherein the voltage gain of each common-base amplifier is substantially unity or of any other suitable value.

* * * * *